United States Patent [19]
Minato et al.

[11] Patent Number: 4,841,486
[45] Date of Patent: Jun. 20, 1989

[54] SEMICONDUCTOR MEMORY DEVICE AND SENSE AMPLIFIER

[75] Inventors: Osamu Minato; Toshiaki Masuhara; Koichiro Ishibashi, all of Tokyo; Shoji Hanamura, Kokubunji; Shigeru Honjyo, Hachioji; Nobuyuki Moriwaki, Kodaira, all of Japan

[73] Assignee: Hitachi, Ltd., Tokyo, Japan

[21] Appl. No.: 946,776

[22] Filed: Dec. 29, 1986

[30] Foreign Application Priority Data

Dec. 27, 1985 [JP] Japan .................. 60-292899

[51] Int. Cl.⁴ .................. G11C 7/00; G11C 11/42
[52] U.S. Cl. .................. 365/207; 365/208; 365/189.09; 365/225.6
[58] Field of Search .................. 357/43; 365/230, 189, 365/177, 207, 208; 307/530; 330/300, 253, 257

[56] References Cited

U.S. PATENT DOCUMENTS

| | | | |
|---|---|---|---|
| 4,045,784 | 8/1977 | Mayumi et al. | 365/230 X |
| 4,298,960 | 11/1981 | Mitake et al. | 365/174 X |
| 4,335,449 | 6/1982 | Nokubo | 307/530 X |
| 4,399,520 | 8/1983 | Arizumi et al. | 365/174 |
| 4,590,438 | 5/1986 | Fukushima et al. | 330/300 |
| 4,604,533 | 8/1986 | Miyamoto et al. | 307/530 |
| 4,626,794 | 12/1986 | Sugimoto | 330/300 X |

Primary Examiner—Stuart N. Hecker
Assistant Examiner—Alyssa H. Bowler
Attorney, Agent, or Firm—Antonelli, Terry & Wands

[57] ABSTRACT

A semiconductor memory device having a memory plane defined by a plurality of memory cells, a decoder line for accessing the memory cells, a common data line on which a signal output from an accessed memory cell is collected, and a sense amplifier for amplifying the signal collected on the common data line. The sense amplifier has an amplifying circuit portion which is composed of a pair of common-collector type bipolar transistors supplied with the signal collected on the common data line as a differential input, and a plurality of MOS transistors for converting a change in current into a change in voltage. Each of the MOS transistors has a lightly-doped drain structure.

19 Claims, 4 Drawing Sheets

SEMICONDUCTOR MEMORY DEVICE AND SENSE AMPLIFIER

BACKGROUND OF THE INVENTION

The present invention relates to a semiconductor memory device and, more particularly, to a static type metal-oxide semiconductor memory device which is capable of amplifying a small differential signal of read cycle with high speed and which is suitable for achieving larger scale integration.

FIG. 1 shows the arrangement of a static type metal-oxide-semiconductor memory device in accordance with one embodiment of the present invention. In the figure, the reference numerals 1 and 2 denote memory cell groups (memory planes), respectively. Each of the unit circuits (memory cells) constituting the memory cell groups 1 and 2 consists of four metal-oxide semiconductor transistors (hereinafter referred to as "MOST's") 4, 5, 6, 7 and resistors 8, 9. The memory cell 3 is accessed by a decoder 12 which drives word lines 10 and 11, and a signal output from the memory cell 3 appears on a pair of data lines 13 and 14 in the form of a small voltage difference. When an ON signal is applied to a terminal $Y_1$, the small differential signal appears on a pair of common data lines 17 and 18 through a pair of switching MOST's 15 and 16. To the common data lines 17 and 18 are also connected the respective drains of another pair of switching MOST's 15' and 16' which are controlled by an ON signal applied to a terminal $Y_2$. For this reason, the parasitic capacitance of the common data lines 17 and 18 is undesirably increased, and this prevents the memory device from operating at high speed. In order to solve this problem, it is a general practice to divide the common data lines into a plurality of regions using switching MOST's, thus improving the performance of the memory device. Exemplary FIG. 1 shows a pair of common data lines which is divided into two regions respectively defined by common data lines 17, 18 and 32, 33. The common data lines 32 and 33 are similarly provided with two pairs of switching MOST's 15", 16" and 15''', 16''' which are respectively controlled by ON signals applied to terminals $Y'_1$ and $Y'_2$. Accordingly, the above-described small differential signal is selected by turning on either a pair of switching MOST's 19, 20 or 21, 22, and supplied to input terminals 24 and 25 of a sense amplifier 23. MOST's 26, 27, 26', 27' and MOST's 28, 29, 30, 31 are loads which are provided for the purpose of maintaining data lines and common data lines at predetermined potentials, respectively. It should be noted that the reference numeral 34 denotes an output buffer for taking out the output of the sense amplifier 23.

Thus, contrivances such as division of common data lines are considered to improve the performance of the memory device, but it is necessary, in order to further improve the performance, to increase the operating speed of the sense amplifier. The sense amplifier is generally arranged such that a small voltage difference input thereto is converted into a current difference, and this is further converted into a voltage difference again. Accordingly, in order to increase the operating speed, it is necessary to use constituent elements in which current greatly changes in accordance with the input voltage. However, the sense amplifier is formed by employing MOST's which are of the same type as that of MOST's used in the memory planes from the viewpoint of manufacturing process and for the purpose of achieving larger scale integration. Accordingly, the current supply capacity is limited, and this disadvantageously limits the improvement in the operating speed.

SUMMARY OF THE INVENTION

Accordingly, it is one object of the present invention to provide a semiconductor memory device so designed that the operating speed of the sense amplifier is increased.

It is another object of the present invention to provide a semiconductor memory device designed to enable larger scale integration.

According to the present invention, a higher speed operation of the sense amplifier is realized by introduction of bipolar transistors, and larger scale integration is realized by adopting a common-collector structure for the introduction of bipolar transistors and by introducing MOST's of lightly-doped drain structure.

DETAILED DESCRIPTION OF THE PREFERRED EMBODIMENTS

Figure 1:
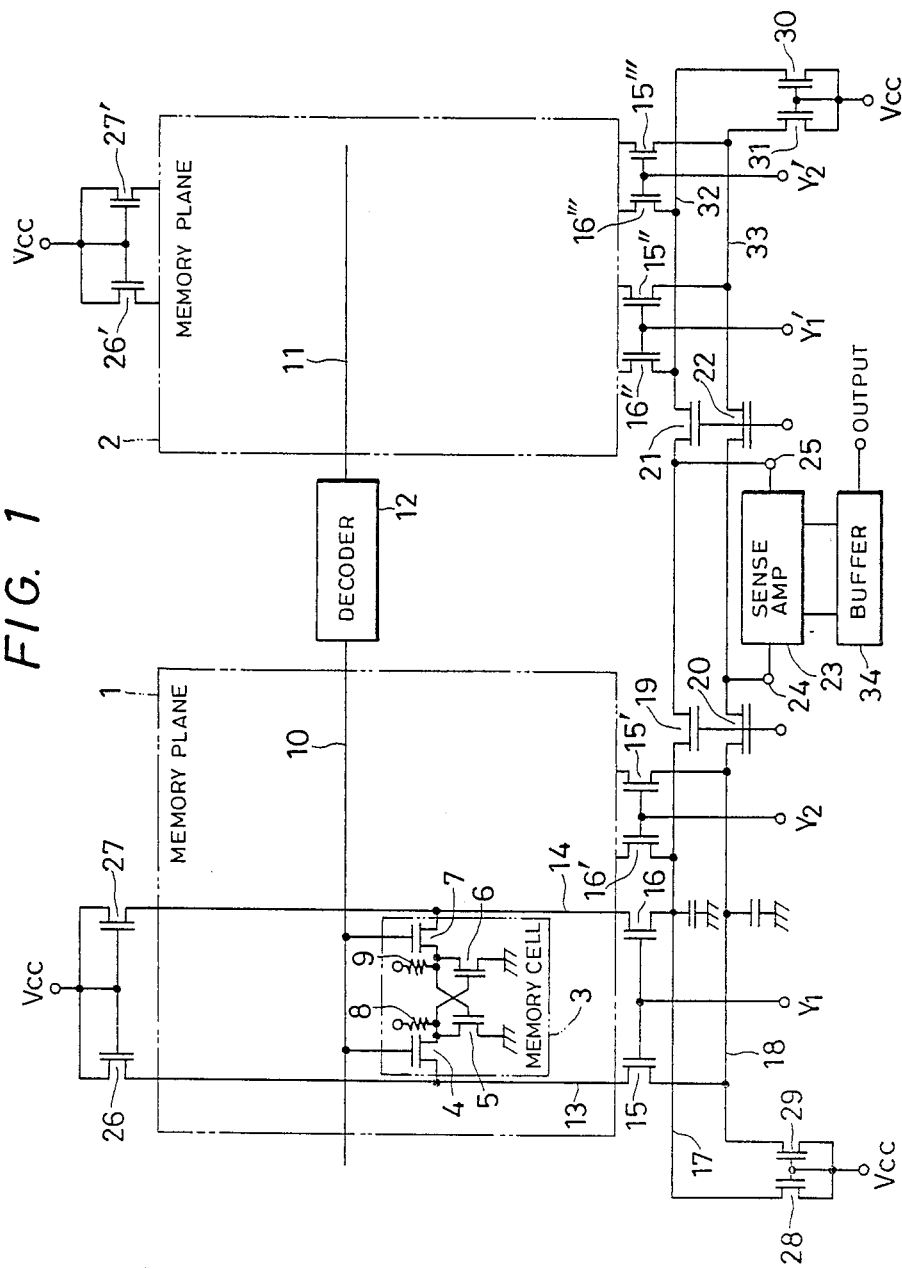
FIG. 1 is a circuit diagram showing the arrangement of a static type MOS memory device in accordance with one embodiment of the present invention.
Figure 2:
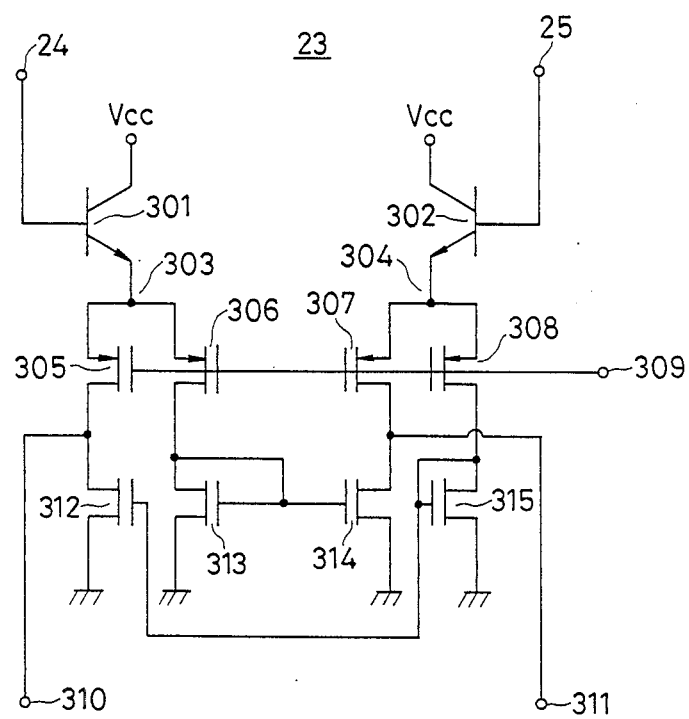
FIG. 2 is a circuit diagram showing in detail the sense amplifier in accordance with the embodiment of the present invention.

FIG. 2 is a circuit diagram showing one example of a sense amplifier employed in one embodiment of the memory device according to the present invention. In the figure, the reference numerals 24 and 25 denote input terminals of a sense amplifier 23 which are supplied with signals from common data lines 17, 18 or 32, 33 through switching MOST's 19, 20 or 21, 22. The numerals 301 and 302 denote a pair of bipolar transistors which receive small differential voltages from the common data lines and pass currents corresponding to voltages applied thereto, respectively. More specifically, small differential voltages which are respectively applied to the pair of input terminals 24 and 25 of the sense amplifier 23 are converted into relatively large differential currents by the bipolar transistors 301 and 302. The numerals 305, 306, 307 and 308 denote P-type MOST's. The respective sources of the P-type MOST's 305 and 306 are connected to the emitter of the bipolar transistor 301, and the sources of the P-type MOST's 307 and 308 are connected to the emitter of the bipolar transistor 302. A predetermined voltage is applied to a gate terminal 309. The numerals 312, 313, 314 and 315 denote N-type MOST's. The drain and gate of the N-type MOST 313 are connected together and further connected to the gate terminal of the N-type MOST 314 and to the drain terminal of P-type MOST 306. Similarly, the drain and gate of the N-type MOST 315 are connected together and further connected to the gate terminal of the N-type MOST 312 and to the drain terminal of P-type MOST 308.

It is assumed that voltages $V_{cc}-V_{th}$ and $V_{cc}-V_{th}-\Delta V$ are respectively applied to the input terminals 24 and 25 of the sense amplifier 23. It should be noted that $\Delta V$ is a small voltage difference which is produced when a memory cell is accessed. The current flowing through the bipolar transistor 301 flows through the MOST's 306 and 313 and biases the gate of the MOST 314. At this time, the current flowing through the bipolar transistor 301 is larger than the current flowing through the bipolar transistor 302, and the voltage at an output terminal 311 lowers to substantially zero volt. In a system constituted by the MOST's 308, 315, 305 and 312, on the other hand, an operation which is completely opposite to the above-described one is performed, and the voltage at an output terminal 310 is consequently raised to a sufficiently high level.

The circuit configuration of this embodiment provides the following advantages: (a) since a small voltage difference is input to the bipolar transistors, the cascading MOST's are driven with increased capacity and at higher speed, and it is possible to obtain a larger voltage amplification factor; (b) the relatively large load capacitance of the amplifier itself is not added to the common data lines, and the size (channel width) of the cascading MOST's is increased, which means that it is possible to obtain a higher speed operation; and (c) the combination of bipolar transistors and MOST's enables obtaining a higher speed operation and a larger amplification factor by making good use of the characteristics of these two kinds of device.

In particular, the bipolar transistors have a common-collector structure as will be described later, so that they can readily be formed with larger scale integration by employing a P-type well in an N-type substrate as the base of each bipolar transistor in the manufacture of ordinary C (complementary) MOSIC's (integrated circuits) and LSI (large-scale integration) circuits. An N-MOST is generally formed in a P-type well. Therefore, it is possible to obtain a higher-speed memory device by a process which is advantageous from the viewpoint of production costs. To improve the performance of bipolar transistors, a shallow P+-type well which is different from the above-described P-type well may be employed. This technique is slightly disadvantageous in terms of production costs but enables a higher speed memory device to be obtained, advantageously.

Figure 3:
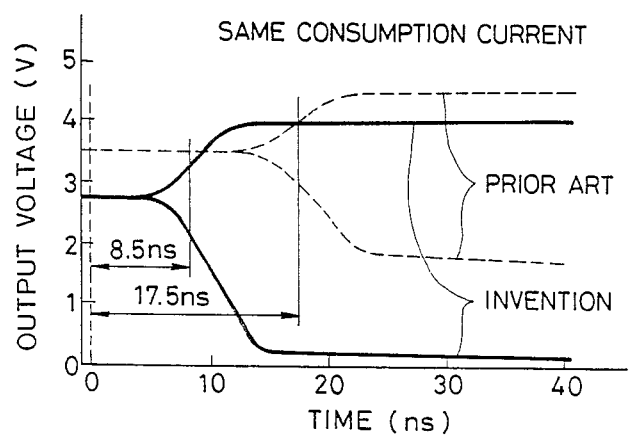
FIG. 3 is a characteristic chart employed to make comparison between characteristics of the sense amplifier in accordance with the embodiment of the present invention and those of a conventionally known sense amplifier.

FIG. 3 is a graph employed to show a comparison between the operating waveform (solid-line curve) of the sense amplifier in accordance with the embodiment shown in FIG. 2 and the operating waveform (chain-line curve) of a conventionally used sense amplifier consisting of MOST's. It will be clear from FIG. 3 that the operating speed of the sense amplifier of this embodiment is two or more times as fast as that of the conventional sense amplifier for the same current consumption, and the amplification factor of the former is also 1.5 times that of the latter, advantageously. It should be noted that the current consumption is determined by the voltage applied to the terminal 309.

Figure 4:
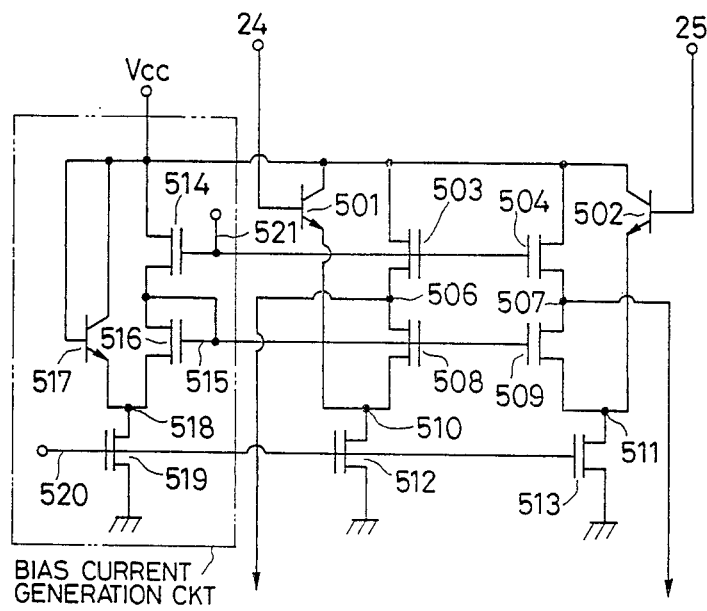
FIG. 4 is a circuit diagram showing in detail a sense amplifier in accordance with another embodiment of the present invention.

FIG. 4 is a circuit diagram showing another embodiment of a sense amplifier which may be employed in the memory device according to the present invention. In the figure, the reference numerals 501 and 502 denote a pair of bipolar transistors which are supplied with small differential voltages from common data lines through input terminals 24 and 25. Changes in the input differential voltages are converted into relatively large changes in current in a manner similar to that in the embodiment shown in FIG. 2. The reference numerals 503, 504, 508, 509, 512 and 513 denote N-type MOST's. The emitters of the bipolar transistors 501 and 502 are respectively connected to interim junctions 510 and 511, respectively. Amplified output voltages are respectively taken out from an interim junction 506 between the N-type MOST's 503 and 508 and an interim junction 507 between the N-MOST's 504 and 509. Predetermined voltages are respectively applied to a gate terminal 521 for the N-type MOST's 503 and 504 and a gate terminal 520 for the N-type MOST's 512 and 513. Thus, each N-type MOST serves as a current sources for supplying a constant current. Further, a gate terminal 515 for the N-type MOST's 508 and 509 is supplied with a bias voltage which is generated from a bias generating circuit consisting of a bipolar transistor 517 and N-type MOST's 514, 516 and 519. This bias voltage is applied for the purpose of determining the value of current flowing through the N-type MOST 519 when the voltage which is input to the bipolar transistor 517 is $V_{cc}-V_{th}$. For example, when the input terminal 24 is at the voltage $V_{cc}-V_{th}$, the same current as that flowing through the N-type MOST 519 flows through the N-type MOST 512. If the constant of the N-type MOST's is determined in advance so that the junction 506 led to an output terminal of the sense amplifier is at a relatively high level when the current flows through the N-type MOST 512, when the voltage $V_{cc}-V_{th}-\Delta V$ is applied to the input terminal 25, the interim junction 511 is at a lower level than that of the interim junction 510, and consequently, the voltage output from the junction 507 led to the output terminal is also at a lower level than that of the junction 506, so that a small input differential voltage is taken out in the form of an amplified output voltage difference.

Although the circuit operation of the sense amplifier in accordance with this embodiment and high-speed and high-amplification characteristics obtained thereby are the same as those of the embodiment shown in FIG. 2, in this embodiment the P-type MOST's 305, 306, 307 and 308 shown in FIG. 2 are changed for the N-type MOST's 508 and 509, thus enabling larger scale integration. Since this embodiment needs the bias generating circuit, the arrangement is apparently disadvantageous in achieving larger scale integration. However, the bias generating circuit is used in common by sense amplifiers for bits which belong to the same word. Therefore, the arrangement of this embodiment as a whole is advantageous for larger scale integration. It should be noted that, if predetermined voltages which are applied to the gate terminals 521 and 520 are controlled by pulses, it is also possible to control the current flowing through the sense amplifier so as to lower the power level when it is not actually used.

Figure 5:
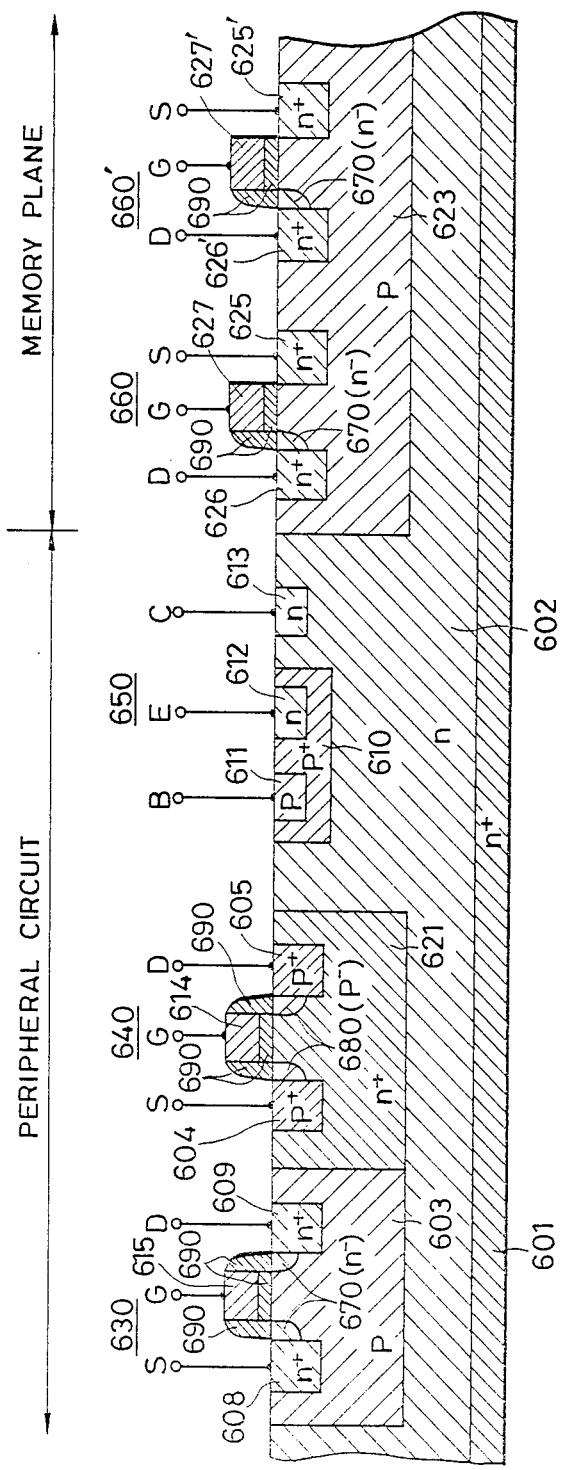
FIG. 5 is a fragmentary sectional view showing one example of the device structure according to the present invention.

FIG. 5 shows a cross section of one example of the arrangement of constituent elements of the semiconductor memory device according to the present invention. A p-type well region 603 is formed in a semiconductor substrate which is defined by an n+-type impurity layer 601 and an n-type semiconductor layer 602. A source S and a drain D which are respectively defined by n+-type impurity regions 608 and 609, together with a gate G which is defined by a region 615, are provided in the p-type well region 603 to form an N-type MOST 630. On the other hand, an n+-type well region 621 is formed in the n-type semiconductor layer 602, and a source S and a drain D which are respectively defined by p+-type impurity regions 604 and 605, together with a gate G which is defined by a region 614, are provided in the n+-type well region 621 to form a P-type MOST 640. The reference numeral 610 denotes a p+-type well region which is shallower than the p-type well region and which has a higher impurity concentration than that of the latter. Thus, a high-performance common-collector type npn bipolar transistors 650 is formed having a base B defined by the p+-type well region 610, an emitter E defined by an n-type impurity region 612, a base electrode terminal B defined by a p-type impurity region 611 and a collector C defined by an n-type impurity region 613. This bipolar transistor 650 can be formed simply by adding a mask for forming the base region 610 to a conventional CMOS manufacturing process. A p-type well region 623 is formed within the semiconductor substrate. Sources 625, 625' and drains 626, 626' which are defined by an n+-type impurity layer are formed in the region 623, and gates 627 and 627' are further provided to form N-type MOST's 660 and 660'.

The npn bipolar transistor 650, the P-type MOS 640, the N-type MOST 630, etc. are used as constituent elements of the sense amplifier shown in FIG. 2, or those of a peripheral circuit of the semiconductor memory device according to the present invention. When all the MOST's except for the P-type MOST formed in the n+-type well region 621 are formed into N-type MOST's, the sense amplifier should be arranged in accordance with the embodiment shown in FIG. 4. The N-type MOST's formed in the p-type well region 623 are employed to form memory cells. This region is therefore used as a memory plane.

In the embodiment shown in FIG. 5, the MOST's are formed so as to have a lightly-doped drain structure. More specifically, the size of the MOST's is reduced in order to achieve larger scale integration, and n−-type regions 670 and p−-type regions 680 for relaxing the electric field are provided for improving the dielectric strength. Since a memory plane can be operated with a lower voltage than that for a peripheral circuit, when the MOST's are employed as constituent elements of a memory plane, these field relaxing regions can be narrowed. Further, the relaxing regions may be omitted from the area between a source S and a gate G which can be isolated from each other relatively easily. Such arrangement is exemplarily illustrated by the N-type MOST's 660 and 660' shown in FIG. 5.

Figure 6:
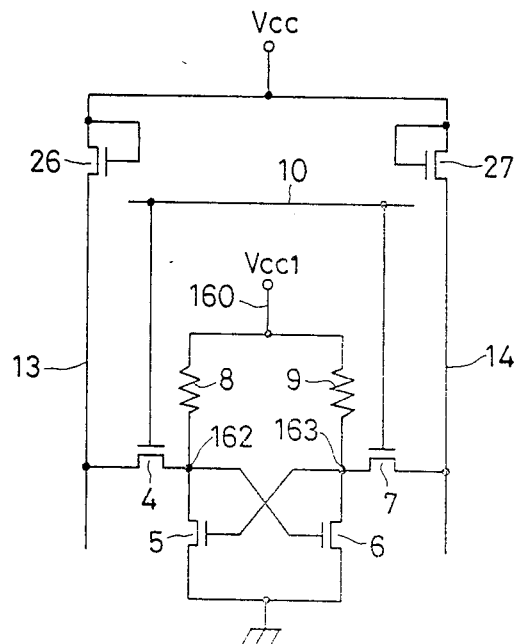
FIG. 6 is a circuit diagram showing a part of still another embodiment of the present invention.

FIG. 6 shows still another embodiment of the present invention in which a memory plane is so designed that larger scale integration is achieved.

The feature of this embodiment resides in that the voltage $V_{cc1}$ applied to a power supply line 160 which is connected to data storage nodes 162 and 163 of a memory cell through resistors 8 and 9 is made lower than the voltage $V_{cc2}$ of a power supply which is supplied to the data lines 13 and 14 and that of a power supply which is supplied to the common data lines 17, 18 and 32, 33, so as to lower the level of the voltage applied between the drain and source of each of the MOST's 4, 5, 6 and 7 which constitute in combination the memory cell. As a result, the dielectric strength of the MOST's constituting the memory cell can be made lower than that of MOST's constituting a peripheral circuit, so that it is possible to reduce the cell area and therefore allow a static type RAM with an increased capacitance to be realized for the same chip area.

As has been described above, the present invention features a sense amplifier which is defined by a combination of a pair of bipolar transistors for current-amplifying a small differential signal of read cycle and a plurality of MOS transistors for converting a current change into a change in voltage. It is therefore possible to realize a sense amplifier which can operate at high speed and with lowered power consumption. Further, MOS transistors having a lightly-doped drain structure can be employed as MOS transistors. In addition, since the voltage applied to a memory cell within a memory plane is made lower than that applied to a peripheral circuit, it is possible to realize a static type memory device of larger scale integration without deteriorating reliability.

It should be noted that, although in the above-described embodiment the present invention has been explained by way of N-type MOS transistors formed on a p-type substrate, the invention may, of course, be applied to N-type MOS transistors formed in a p-type well within an n-type substrate. Further, even when the conductivity types of impurities and wells employed in the described embodiments are opposite, it is possible to obtain the same advantages as those offered by the embodiments.

What is claimed is:

1. A semiconductor memory device having a memory plane defined by a plurality of memory cells, a decoder for accessing said memory cells, a data line on which a signal output from an accessed memory cell is transmitted, and a sense amplifier for amplifying the signal transmitted on said data line, said sense amplifier comprising:
   first and second common-collector bipolar transistors, wherein the collectors are supplied with a predetermined first operating potential and the bases of which are differentially driven by a differential input signal from said accessed memory cell;
   first and second P-channel MOSFETs, wherein the sources are respectively coupled to the emitters of said first and second common-collector bipolar transistors and the gates of which are supplied with a predetermined bias voltage;
   first and second N-channel MOSFETs, wherein the sources are supplied with a second operating potential, the drains of which are respectively coupled to the drains of said first and said second P-channel MOSFETs, the gates of which are coupled to each other, and wherein said first and second N-channel MOSFETs include a source-drain current path operating as an input current path and an output current path, respectively, of a current mirror circuit; and
   a first sense output signal is provided at a first circuit node at the coupling of said drain of said second P-channel MOSFET and said drain of said second N-channel MOSFET.

2. A semiconductor memory device having a sense amplifier according to claim 1, further comprising:
   third and fourth P-channel MOSFETs, wherein the sources are respectively coupled to the emitters of said first and second common-collector bipolar transistors and the gates of which are supplied with said predetermined bias voltage;

third and fourth N-channel MOSFETs, wherein the sources are supplied with said second operating potential, the drains of which are respectively coupled to the drains of said third and said fourth P-channel MOSFETs, the gates of which are coupled with each other, and wherein said third and fourth N-channel MOSFETs include source-drain current paths operating as a second output current path and a second output current path and a second input current path, respectively, of said current mirror circuit; and a second sense output signal is provided at a second circuit node at the coupling of said drain of said third P-channel MOSFET and said drain of said third N-channel MOSFET.

3. A semiconductor memory device having a sense amplifier according to claim 2, wherein the gates of said first and second N-channel MOSFETs are directly connected to each other and to the drain of said first N-channel MOSFET.

4. A semiconductor memory device having a sense amplifier according to claim 3, wherein the gates of said third and fourth N-channel MOSFETs are directly connected to each other and to the drain of said fourth N-channel MOSFET.

5. A semiconductor memory device having a sense amplifier according to claim 4, wherein said first and second common-collector bipolar transistors are NPN-type and wherein the emitters of which are respectively directly connected to the sources of said first and third P-channel MOSFETs and the sources of said second and fourth P-channel MOSFETs, respectively.

6. A semiconductor memory device having a memory plane defined by a plurality of memory cells, a decoder for accessing said memory cells, a data line on which a signal output from an accessed memory cell is transmitted, and a sense amplifier for amplifying the signal transmitted on said data line, said sense amplifier comprising:
first and second common-collector bipolar transistors, wherein the collectors are supplied with a first operating potential and the bases of which are differentially driven by a differential input signal from said accessed memory cell;
first and second MOSFETs of a first channel conductivity type, wherein the sources are respectively coupled to the emitters of said first and second common-collector bipolar transistors and the gates of which are supplied with a predetermined first bias voltage;
first and second current sources respectively coupled between a second operating potential and the emitters of said first and second common-collector bipolar transistors; and
first and second load means respectively coupled between said predetermined first operating potential and the drains of said first and second MOSFETs and wherein first and second sense output signals are provided at a first circuit node coupled to said drain of said first MOSFET and at a second circuit node coupled to said drain of said second MOSFET, respectively.

7. A semiconductor memory device having a sense amplifier according to claim 6, wherein the emitters of said first and second common-collector bipolar transistors are directly connected to the sources of said first and second MOSFETs, respectively.

8. A semiconductor device having a sense amplifier according to claim 7, wherein said first and second current sources are constant current sources.

9. A semiconductor device having a sense amplifier according to claim 8, wherein said first and second current sources comprise third and fourth MOSFETs of said first channel conductivity type, biased at the gates, and respectively connected between the emitters of said first and second common-collector bipolar transistors and said second operating potential.

10. A semiconductor device having a sense amplifier according to claim 9, wherein said second operating potential is circuit ground.

11. A semiconductor device having a sense amplifier according to claim 10, wherein said first and second load means comprise fifth and sixth MOSFETs of said first channel conductivity type, having biased gates, and respectively coupled between the drains of said first and second MOSFETs and said first operating potential.

12. A semiconductor device having a sense amplifier according to claim 11, further comprising a biasing circuit including a diode-connected bipolar transistor coupled on its collector side to said first operating potential and on its emitter side to the drain of a seventh MOSFET of said first channel conductivity type whose source is coupled to said circuit ground and which is biased to operate as a constant current source by a predetermined voltage level supplied to its gate and which also biases said fifth and sixth MOSFETs; an eighth MOSFET of said first channel conductivity type having a gate-to-drain self-biasing connection and coupled at its source to the drain of said seventh MOSFET and at its drain to the source of a ninth MOSFET of said first channel conductivity type whose drain is coupled to said first operating voltage and whose gate is supplied with a bias signal which supplies the gates of said fifth and sixth MOSFETs.

13. A semiconductor memory device having a sense amplifier according to claim 12, wherein said first and second common-collector bipolar transistors are NPN type, said first through ninth MOSFETs are N-channel conductivity type and said diode-connected bipolar transistors is an NPN-type.

14. For a semiconductor memory device, a sense amplifier for reading and amplifying differential data information and powered by a supply voltage, comprising:
a pair of common-collector coupled bipolar transistors, each having a base receiving a differential data signal and an emitter;
first, second, third and fourth MOSFETs of a first channel conductivity type, each having a first, second and control electrodes, wherein the first electrode of each said first and third MOSFET is coupled to the emitter of said first bipolar transistor and the first electrode of each said second and fourth MOSFET is coupled to the emitter of said second bipolar transistor, the control electrodes of said first through fourth MOSFETs being supplied with a predetermined bias voltage; and
fifth, sixth, seventh and eighth MOSFETs of a second channel conductivity type, different from said first type, said fifth MOSFET having a first electrode coupled to the second electrode of said first MOSFET and a control electrode coupled to its first electrode, said sixth MOSFET having a first electrode coupled to the second electrode of said second MOSFET and a control electrode coupled to the control electrode of said fifth MOSFET, said seventh MOSFET having a first electrode coupled to the second electrode of said third MOSFET and a control electrode coupled to the control electrode of said eighth MOSFET, said eighth MOSFET having a first electrode coupled to its control electrode and to the second electrode of said fourth MOSFET, said second electrodes of said fifth through eighth MOSFETs being coupled to a voltage reference, and wherein differential outputs are provided at the first electrodes of said sixth and seventh MOSFETs.

15. The sense amplifier according to claim 14, wherein said pair of bipolar transistors are NPN-type transistors.

16. The sense amplifier according to claim 15, wherein said first channel conductivity type is a P-channel conductivity type and said second channel conductivity type is a N-channel conductivity type, the first and second electrodes of said first through fourth MOSFETs are source and drain electrodes, respectively, and the first and second electrodes of said fifth through eighth MOSFETs are drain and source electrodes, respectively.

17. The sense amplifier according to claim 16, wherein said differential outputs being coupled to a buffer.

18. For a semiconductor memory device, a sense amplifier for reading and amplifying differential data information and powered by a supply voltage, comprising:

a pair of common-collector coupled bipolar transistors each having a base receiving a differential data signal and an emitter for providing an emitter follower output; and a current mirror circuit including a first controlling current path composed of a first series connection of complementary channel MOSFETs coupled at one end to the emitter of a first one of said pair of bipolar transistors and at a second end to circuit ground, and a first controlled current path for providing an output and responsive to said first controlling current path composed of a second series connection of complementary channel MOSFETs coupled at one end to the emitter of a second of said pair of bipolar transistors and at a second end to said circuit ground, a second controlling current path composed of a third series connection of complementary channel MOSFETs, coupled at one end to said second bipolar transistor emitter and at a second end to said circuit ground, and a second controlled current path for providing a second output therefrom and responsive to said second controlling current path composed of a fourth series connection of complementary channel MOSFETs coupled at one end to said first bipolar transistor emitter and at second end to said circuit ground.

19. The sense amplifier according to claim 18, wherein said pair of bipolar transistors are NPN-type transistors and wherein said first bipolar transistor emitter is directly connected to a source electrode of a P-channel MOSFET of each one of said first and third series connections and said second bipolar transistor emitter is directly connected to a source electrode of a P-channel MOSFET of each one of said second and fourth series connections.

* * * * *